United States Patent
Sikdar et al.

(10) Patent No.: US 9,496,009 B2
(45) Date of Patent: Nov. 15, 2016

(54) MEMORY WITH BANK-CONFLICT-RESOLUTION (BCR) MODULE INCLUDING CACHE

(71) Applicant: MoSys, Inc., Santa Clara, CA (US)

(72) Inventors: Dipak Sikdar, Santa Clara, CA (US); Michael J. Miller, Saratoga, CA (US); Jay Patel, Los Gatos, CA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 13/841,025

(22) Filed: Mar. 15, 2013

(65) Prior Publication Data

US 2013/0332665 A1 Dec. 12, 2013

Related U.S. Application Data

(60) Provisional application No. 61/656,423, filed on Jun. 6, 2012.

(51) Int. Cl.
| | |
|---|---|
| *G11C 7/10* | (2006.01) |
| *G06F 12/08* | (2016.01) |
| *G11C 8/12* | (2006.01) |
| *G11C 8/18* | (2006.01) |
| *G11C 11/417* | (2006.01) |

(52) U.S. Cl.
CPC .......... *G11C 7/1072* (2013.01); *G06F 12/0802* (2013.01); *G11C 7/1039* (2013.01); *G11C 8/12* (2013.01); *G11C 8/18* (2013.01); *G11C 11/417* (2013.01); *G06F 2212/304* (2013.01); *G11C 2207/2209* (2013.01); *G11C 2207/2245* (2013.01)

(58) Field of Classification Search
CPC .................. G06F 12/0246; G06F 2212/7208; G06F 21/79; G06F 11/141; G06F 12/1081; G06F 12/0802; G06F 2212/304; G11C 7/1045; G11C 11/4096; G11C 7/1072; G11C 8/12; G11C 8/18; G11C 7/1039; G11C 11/417; G11C 2207/2245; G11C 2207/2209

USPC .................. 711/3, 5, 100, 104, 147–149, 150
See application file for complete search history.

(56) References Cited

U.S. PATENT DOCUMENTS

| | | | | |
|---|---|---|---|---|
| 5,813,046 | A | * | 9/1998 | Liedtke .......................... 711/210 |
| 5,999,474 | A | | 12/1999 | Leung et al. |

(Continued)

FOREIGN PATENT DOCUMENTS

KR  20090060666  6/2009

OTHER PUBLICATIONS

"ISA/KR, International Search Report and Written Opinion for International Application No. PCT/US2013/044390", 9 Pages.

*Primary Examiner* — Zhuo Li
(74) *Attorney, Agent, or Firm* — Wagner Blecher LLP

(57) ABSTRACT

A memory device includes a block of memory cells and a cache. The block of memory cells is a random access memory with multiple ports. The block of memory cells is partitioned into subunits that have only a single port. The cache is coupled to the block of memory cells adapted to handle a plurality of accesses to a same subunit of memory cells without a conflict such that the memory appears to be a random access memory to said plurality of accesses. A method of operating the memory, and a memory with bank-conflict-resolution (BCR) module including cache are also provided.

29 Claims, 5 Drawing Sheets

(56) References Cited

U.S. PATENT DOCUMENTS

| | | | |
|---|---|---|---|
| 6,393,512 B1* | 5/2002 | Chen et al. | 711/5 |
| 6,400,619 B1* | 6/2002 | Hsu et al. | 365/200 |
| 6,449,685 B1 | 9/2002 | Leung | |
| 7,984,246 B1* | 7/2011 | Yung et al. | 711/147 |
| 8,359,438 B2 | 1/2013 | Bartlett | |
| 8,374,050 B2 | 2/2013 | Zhou et al. | |
| 2004/0190362 A1* | 9/2004 | Hosokawa | G11C 7/1066 365/230.03 |
| 2010/0325367 A1 | 12/2010 | Kornegay et al. | |
| 2011/0145513 A1* | 6/2011 | Iyer | G06F 12/0844 711/141 |
| 2011/0289256 A1 | 11/2011 | Bartlett | |
| 2011/0310691 A1* | 12/2011 | Zhou | G11C 8/16 365/230.03 |

* cited by examiner

MEMORY WITH BANK-CONFLICT-RESOLUTION (BCR) MODULE INCLUDING CACHE

CROSS-REFERENCE TO RELATED U.S. APPLICATIONS

This application claims priority to and benefit of co-pending U.S. Patent Application No. 61/656,423, filed on Jun. 6, 2012, entitled, "MEMORY WITH BANK-CONFLICT-RESOLUTION (BCR) MODULE INCLUDING CACHE," by Patel et al., and assigned to the assignee of the present application.

TECHNICAL FIELD

Embodiments of the present invention relate generally to the field of semiconductor memory technology.

BACKGROUND

The growth of the Internet has placed ever increasing demands on routers, servers, and switches for increased bandwidth to keep pace with increasing network loads, for just one example, increased loads associated with video streaming. As a result, semiconductor RAM technology has been advancing to supply information storage capacities for the increased bandwidth associated with such increased loads. However, conventional semiconductor RAM technology, for example, quadruple data-rate (QDR) static random-access memory (SRAM), is both expensive, and consumes large amounts of power, due to the six-transistor SRAM memory-cell design employed by QDR SRAM memories.

SUMMARY

Embodiments of the present invention include a memory. The memory includes a block of memory cells and a cache. The block of memory cells is a random access memory with multiple ports. The block of memory cells is partitioned into subunits that have only a single port. The cache is coupled to the block of memory cells adapted to handle a plurality of accesses to a same subunit of memory cells without a conflict such that the memory appears to be a random access memory to the plurality of accesses. Other embodiments of the present invention include a method of operating the memory, and a memory with bank-conflict-resolution (BCR) module including cache.

DESCRIPTION OF THE DRAWINGS

The accompanying drawings, which are incorporated in and form a part of this specification, illustrate embodiments of the invention and, together with the description, serve to explain the embodiments of the invention.

Figure 1:
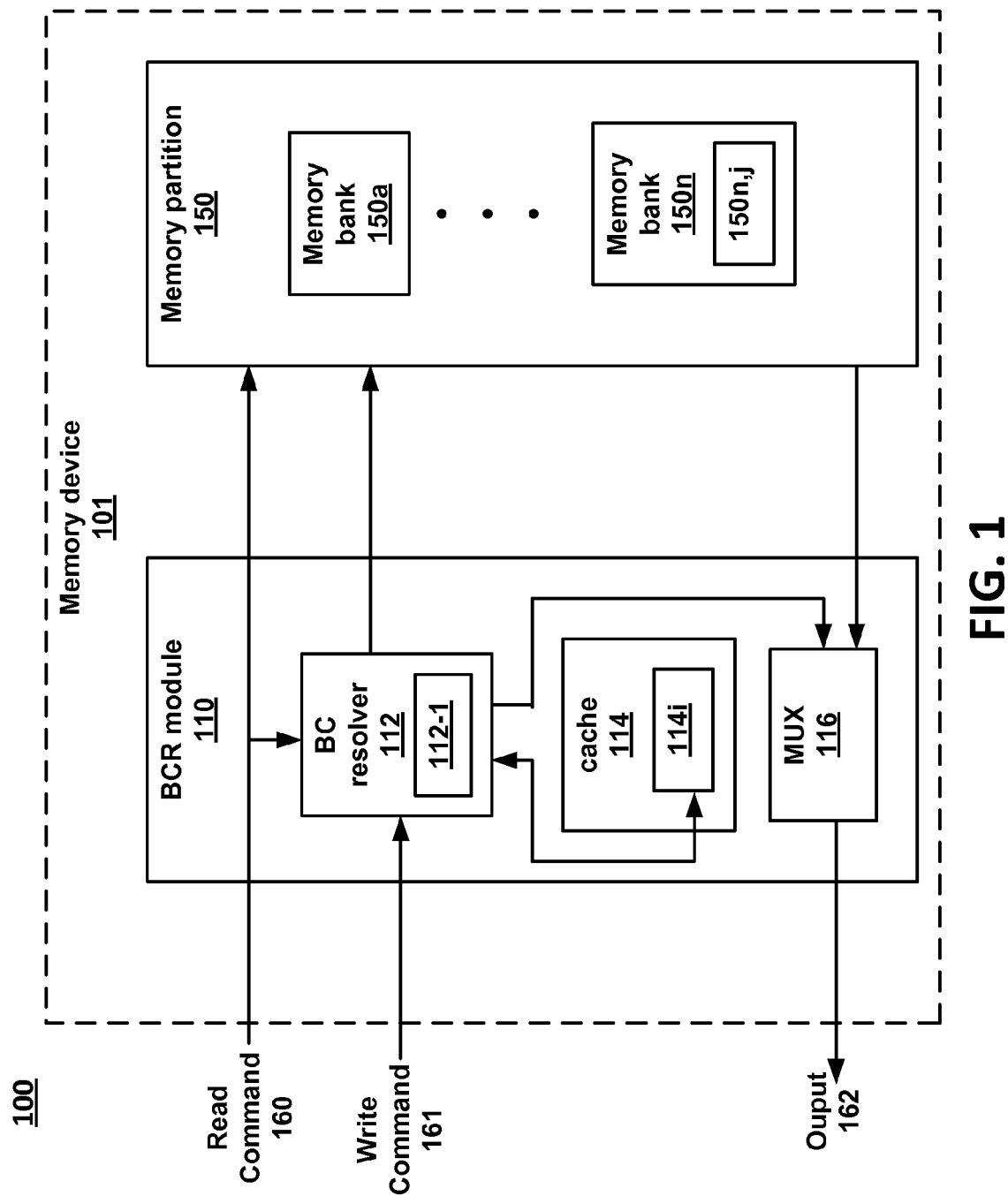
FIG. 1 is a block diagram of a memory device with a bank-conflict-resolution (BCR) module including cache, in accordance with embodiments of the present invention.

The drawings referred to in this description should not be understood as being drawn to scale except if specifically noted.

DESCRIPTION OF EMBODIMENTS

Reference will now be made in detail to the alternative embodiments of the present invention. While the invention will be described in conjunction with the alternative embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it should be appreciated that embodiments of the present invention may be practiced without these specific details. In other instances, well known methods, procedures, and components have not been described in detail as not to unnecessarily obscure embodiments of the present invention. In the FIGS. and throughout the written description, herein, like reference numerals are used for similar elements of embodiments of the present invention.

Physical Description of Embodiments of a Memory with a Bank-Conflict-Resolution (BCR) Module Including Cache Embodiments of the present invention include a memory device, for example, a serial memory device 101 (see FIG. 1), without limitation thereto, that includes a block of memory cells in a memory partition and a cache. The block of memory cells is a random-access memory (RAM) with multiple ports. The block of memory cells is partitioned into subunits, wherein the subunits have only a single port. The cache is coupled to the block of memory cells adapted to handle a plurality of accesses to a same subunit of memory cells without a conflict such that the memory appears to be a random access memory to the plurality of accesses.

In accordance with embodiments of the present invention, the plurality of accesses may include one or more of a read command and a write command. A number of addressable locations in the cache is at least approximately equal to a number of addressable locations in the single subunit of the memory.

In one embodiment, the memory may include a flat memory that is adapted to perform multiple accesses concurrently. The memory may be adapted such that a read command is able to be performed without latency relative to a write command. The memory may be adapted such that a host scheduler is able to write and to read to a same subunit without having a conflict of the read command and the write command. The memory may be also adapted such that a read operation and a write operation are able to be performed to a same address in the subunit without a conflict. The memory may have a single read port and a single write port. By way of example, in accordance with embodiments of the present invention, the memory may be a serial memory, embodiments of which are subsequently described herein, without limitation thereto.

Embodiments of the present invention address the issue of providing a serial memory that provides similar performance to that of a quadruple data-rate (QDR) static random-access memory (SRAM) in the event of simultaneous read and write operations.

With reference now to FIG. 1, in accordance with embodiments of the present invention, a block diagram 100 is shown of a serial memory 101 with a bank-conflict-resolution (BCR) module 110. As shown in FIG. 1, the serial memory device 101 includes a BCR module 110 and a memory partition 150.

The BCR module 110 includes a cache 114 and a bank-conflict resolver 112 that includes BCR logic. In one embodiment, the serial memory device 101 with BCR module 110 provides for (1) reading from cache 114, if a data word that is sought by a read command is in the cache 114; and, (2) writing a data word to the cache 114, if the actual bank in the memory partition 150 addressed by a write command is occupied. The data word is posted in the cache 114, and later the write is completed when the bank is not being read by a read command. The BCR module 110 may be centrally located on a die on which the serial memory 101 is fabricated.

In one embodiment, the BCR module 110 operates in a manner similar to a direct mapped cache, except that the cache 114 is only filled by write commands, and read commands are satisfied from the cache 114, or an actual memory bank in the memory partition 150.

With further reference to FIG. 1, in accordance with embodiments of the present invention, the memory device 101 with BCR module 110 utilizes a direct mapped write cache with a tag for the bank number.

More specifically, when write command 161 arrives and the target memory bank is busy with a read, if the cache data contained at the cache location is valid, (1) the cache location in the cache is flushed and the cache data is moved to a different memory bank than addressed by the write command, and (2) the data word of the write command is put in the cache.

However, when read command 160 arrives, (1) the bank-conflict resolver 112 looks in the cache 114 to determine if the cache data stored there is valid data; and (2) the read command 160 reads the memory location in the memory bank of the memory partition 150. Thus, an unrestricted write command, UWR, and an unrestricted read command, URD, utilize the BCR module 110.

On the other hand, a restricted write command, WR, and a restricted read command, RD, are subject to memory bank restrictions so that restricted write command, WR, and a restricted read command, RD, do not overlap addresses controlled by the BCR module 110. Therefore, the restricted write command, WR, and a restricted read command, RD, utilize 'uncached' operation codes (OP-codes).

In various embodiments, block diagram 100 shows component parts of the serial memory device 101 with BCR module 110. The memory partition 150 includes a plurality of memory banks. For example, memory partition 150 includes a first memory bank 150a and an arbitrarily selected memory bank 150n to which a read command and/or a write command is addressed. It should be appreciated that memory partition 150 can include any number of memory banks (which are referenced herein as memory banks 150a-n or memory banks 150a, 150n).

A memory bank includes an r by c array of memory cells, where c is the width of the array, and r is the length of the array. In one embodiment, the memory bank 150n of the memory partition 150 of memory banks 150a, 150n may include a 1T-SRAM. By way of example, the width of a memory bank may be 72 cells to accommodate a data word that is 72 bits long; and the length of a memory bank may be $2^{15}$, or 32K. All the memory banks in the memory partition 150 have the same length and width; and, by way of example, the number of memory banks in a memory partition 150 is 64.

Each memory bank includes a memory location. A memory location for storing a data word, for example, memory location 150n, j, in a memory partition 150 is indicated by a bank number, given by index, n, and a storage location in the bank, given by the index, j.

The BCR module 110 includes a cache 114, as described above. Similar to the memory bank, a cache 114 includes a r×d array of memory cells, where d is the width of the array, and r is the length of the array. The length, r, of the cache is equal to the length, r, of any memory bank in the memory partition 150. However, the width, d, of the cache 114 is greater than the width, c, of a memory bank in the memory partition 150. By way of example, the width of the memory cache may be 88 cells long to accommodate addition information of cache data 214i (see FIG. 2) that is 88 bits long, which is stored in a cache location 114i. A cache location for cache data, for example, cache location 114i, in the cache 114 is indicated by a cache storage location in the cache, given by an index, i.

The BCR module 110 is configured to store cache data 214i (see FIG. 2) that includes a data word in a cache location 114i of the cache 114 in response to a write command, if the data word is addressed to a memory location 150n, j of a memory bank 150n in the memory partition 150 that is simultaneously being read in response to a read command.

Figure 2:
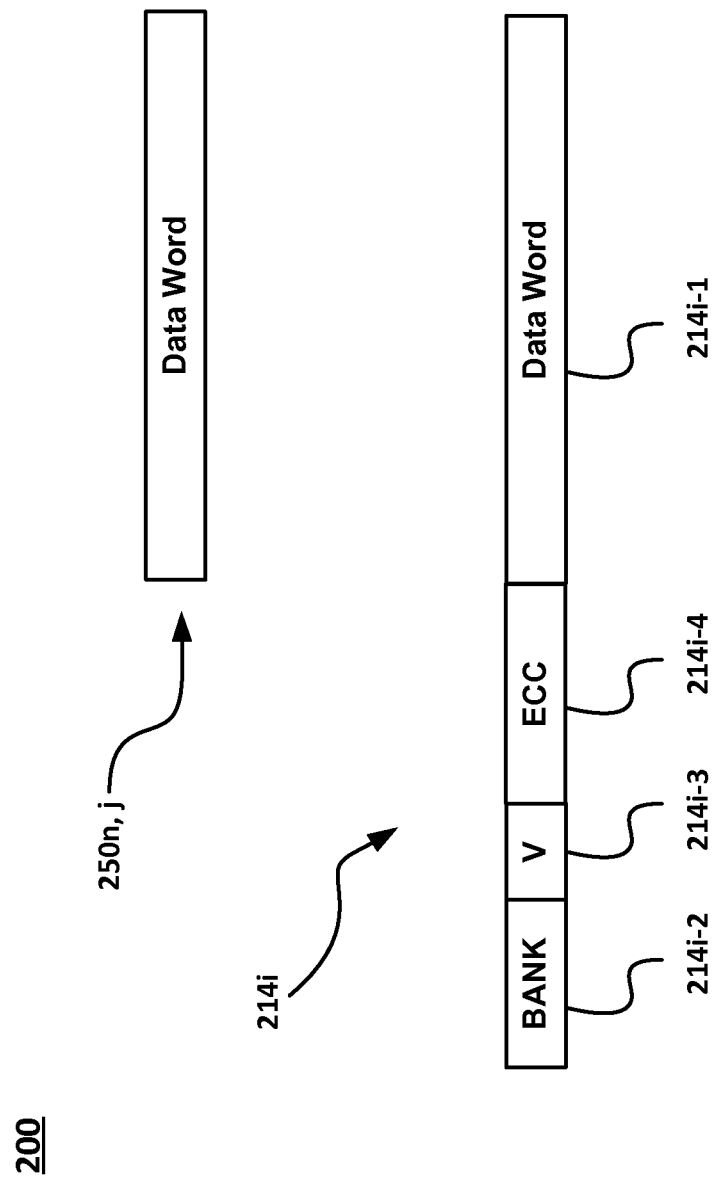
FIG. 2 is a schematic diagram comparing a data structure of a data word stored in a memory location of a memory bank of a memory partition with a data structure of cache data stored in a cache location of a cache of the BCR module, in accordance with embodiments of the present invention.

With reference now to FIG. 2, in accordance with embodiments of the present invention, a schematic diagram 200 is shown of the structure of memory data stored in a memory location of a memory bank of a memory partition 150. For example, memory data 250n, j is stored in memory bank 150n of memory partition 150, and the structure of cache data 214i stored in a cache location 114i of cache 114.

FIG. 2 shows the data structure of memory data 250n, j, and the data structure of cache data 214i. The memory data 250n, j includes a data word.

The cache data 214i includes a data word portion 214i-1, tag data 214i-2 including an index, I, that identifies a memory bank, for example, memory bank 150n of the memory location 150n, j, validity data 214i-3, and error-correction-code data 214i-4. The memory bank 150n has a memory-bank data-word width, and the BCR module 110 has a BCR-cache data-word width equal to the memory-bank data-word width.

In various embodiments, validity data 214i-3 may include two bits that describe whether valid data has been stored in the first 36 bits of the data word portion 214i-1, the second 36 bits of the data word portion 214i-1, both the first and second 36 bits of the data word portion 214i-1, or in neither the first and second 36 bits of the data word portion 214i-1. Thus, only those portions of the cache data 214i that had been written with valid data will be indicated by the value of the validity bits.

For example, a value of the validity bits of 01 may indicate that only the first 36 bits of the data word portion 214i-1 have valid data; a value of the validity bits of 10 may indicate that only the second 36 bits of the data word portion 214*i*–1 have valid data; a value of the validity bits of 11 may indicate that both the first and second 36 bits of the data word portion 214*i*–1 have valid data; and, a value of the validity bits of 00 may indicate that neither the first, nor second 36 bits, of the data word portion 214*i*–1 have valid data.

Referring again to FIG. 1, in accordance with embodiments of the present invention, the BCR module 110 further includes a bank-conflict resolver 112 (or BC resolver). In addition, the bank-conflict resolver 112 includes various blocks of circuitry, of which block 112-1 is an example, selected from the group consisting of: a register for the data word portion of the write command, a register for the index of the memory location in the memory bank addressed by the write command, a register for the index of the memory location in a memory bank addressed by the read command, a register for the index of the cache location in the cache, a register for the memory bank in the memory partition 150 addressed by the write command, a register for the memory bank in the memory partition 150 addressed by the read command, a register for the tag data of cache data stored in the cache location of the cache, comparators for comparing various values stored in the registers, BCR logic for executing instructions based on comparing various values stored in the registers, and error correction circuitry, without limitation thereto.

The BCR module 110 may also include at least one a tag data register and tag data comparator. The bank-conflict resolver 112 is configured to store cache data 214*i* in the cache 114.

The BCR module 110 further includes a read-output multiplexer 116 (which may be referred to by the term of art, "MUX") configured to (1) send a data word portion 214*i*–1 from the cache 114 for output 162 from the serial memory 101 if a tag data 214*i*–2 is identical to a memory location 150*n*, j that is being addressed by the read command, and (2) send a data word 250*n*, j from the memory bank 150*n* of the memory partition 150 as output from the serial memory 101 if the tag data 214*i*–2 is different from the memory location 150*n*, j that is being addressed by the read command.

The bank cycle time ($t_{RC}$) of the BCR module 110 may be one half $t_{RC}$ of a memory bank 150*n* of the memory partition 150.

The bank-conflict resolver 112 is configured to test validity data 214*i*-3 of the cache data 214*i* for validity of the cache data 214*i*, and if the validity data 214*i*–3 indicates that the cache data 214*i* is invalid, to write the data word to the memory location 150*n*, j of the memory bank 150*n* in the memory partition 150.

In addition, the bank-conflict resolver 112 is configured to test validity data 214*i*-3 of the cache data 214*i* for validity of the cache data 214*i*, and if the validity data 214*i*–3 indicates that the cache data 214*i* is valid, to test tag data 214*i*–2 of the cache data 214*i* for equality with a memory address of the memory location 150*n*, j.

Also, if the tag data 214*i*–2 of the cache data 214*i* indicates that the tag data 214*i*–2 of the cache data 214*i* equals a memory address of the memory location 150*n*, j, the bank-conflict resolver 112 is configured to merge-modify the data word with a data word portion 214*i*–1 of the cache data 214*i* stored in the cache.

On the other hand, if the tag data 214*i*–2 of the cache data 214*i* indicates that the tag data 214*i*–2 of the cache data 214*i* does not equal a memory address of the memory location 150*n*, j, the bank-conflict resolver 112 is configured to write the data word into the memory location 150*n*, j of the memory bank 150*n* in the memory partition 150. The bank-conflict resolver 112 may further include an error-correction-code (ECC) module configured to correct errors in the data word.

Figure 3:
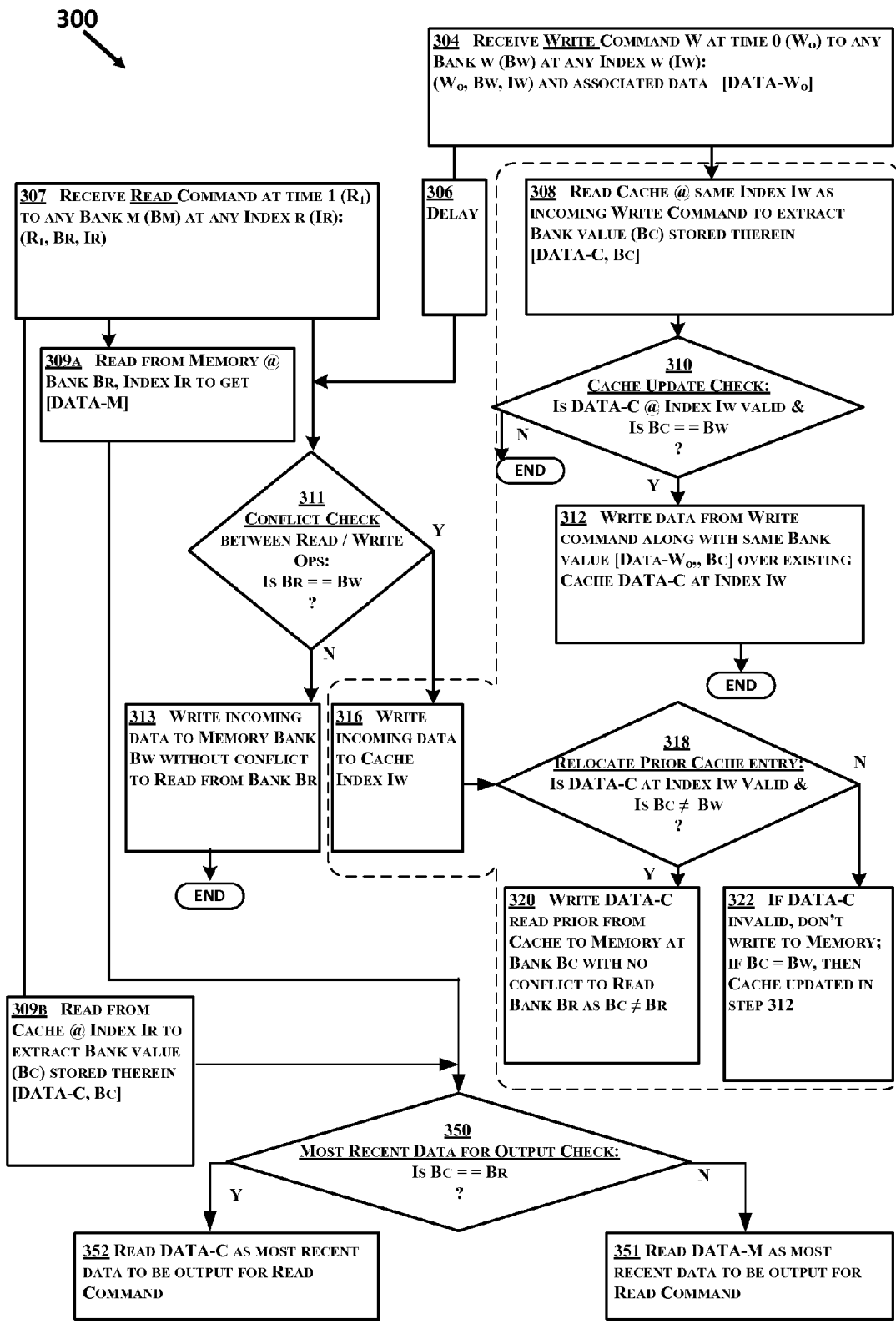
FIG. 3 is a flow chart illustrating a method of operating the memory with BCR module, in accordance with embodiments of the present invention.

With reference now to FIG. 3, in accordance with embodiments of the present invention, a flow chart 300 is shown of a method of operating the memory device 101 with BCR module 110. The method includes the following operations. At 304, a Write Command (e.g., write command 161) at time 0, Wo, is received for a memory bank, Bw, and a memory location having an index, Iw, in the memory bank, Bw, that is addressed by the Write Command.

The Write Command can be designated as: (Wo, Bw, Iw). The Write Command also includes an associated data word that is designated by: [DATA-Wo].

As shown in FIG. 3, below operation 304, the flow chart 300 is divided into two portions: in one portion primarily on the left-hand side of FIG. 3 and outside of the dashed lines, operations related primarily to a Read Command are shown; and, in another portion on the right-hand side of FIG. 3, operations related to the Write Command, (Wo, Bw, Iw), are shown, which are included inside the dashed lines.

In various embodiments, as depicted in FIG. 3, one or more of following operations may occur during use of memory device 101, according to flow chart 300: at 306, a delay occurs; at 307, receive a read command at time, 1, to any memory bank at any index; at 308, cache is read at same index as incoming write command to extract bank value stored therein; at 309*a*, memory is read at a memory bank at a memory index to retrieve the data; at 309*b*, read from cache at the index to extract the bank value stored therein; at 310, update cache; at 311, checking for conflicts between read and write operations; at 312, write data from write command along with same bank value over existing cache data at an index; at 313, write incoming data to a memory bank without conflict to read from the memory bank; at 316, write incoming data to the cache index; at 318, relocate prior cache entry; at 320, write the data read prior from cache to memory at a memory bank with no conflict to read bank; at 322, if the data is invalid, do not write to memory; at 350, check most recent data for output; at 351, read data as most recent data to be output (e.g., output 162) for a read command (e.g., read command 160); and at 352, read data as most recent data to be output (e.g., output 162) for a read command (e.g., read command 160).

Figure 4:
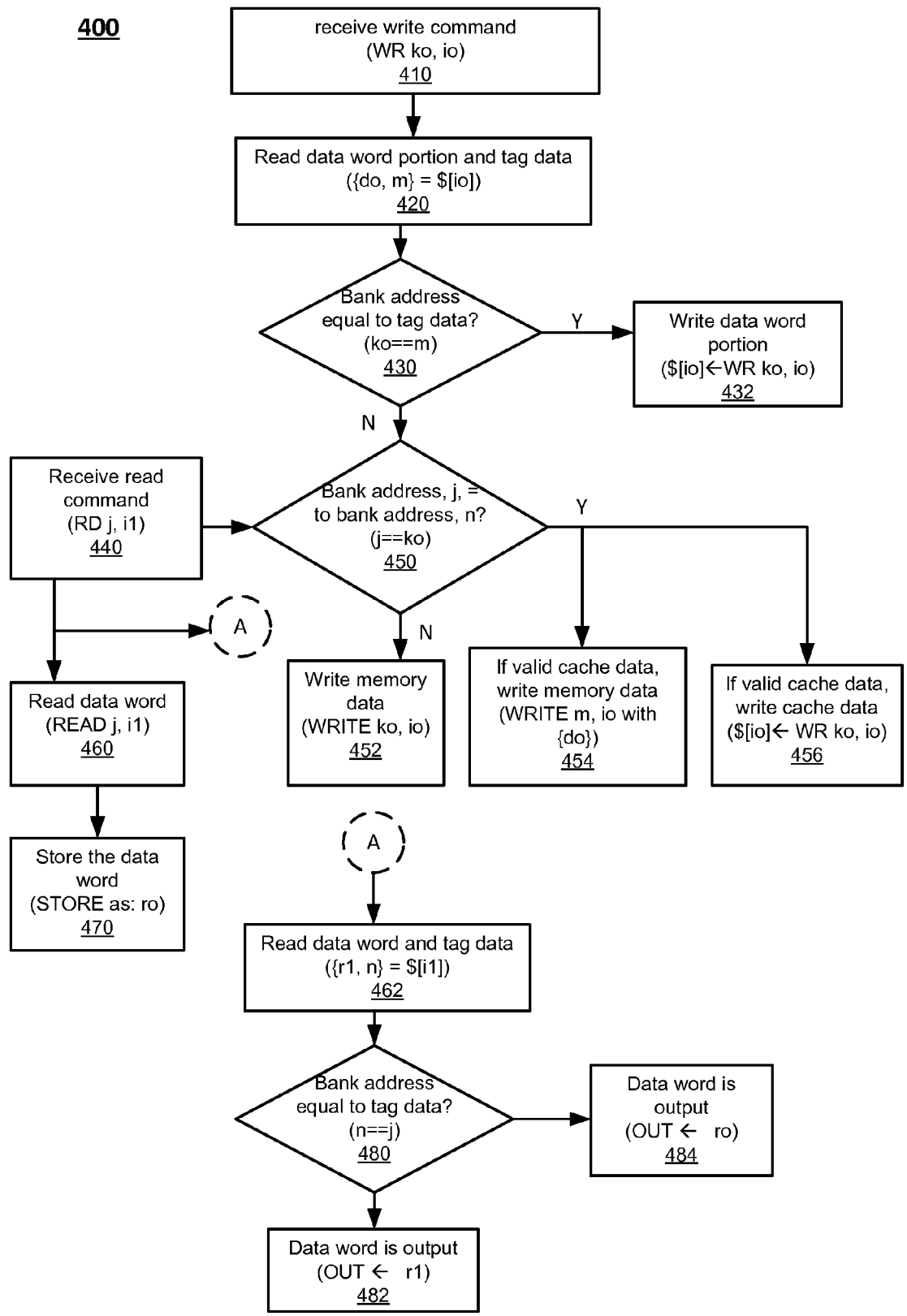
FIG. 4 is a flow chart illustrating the method of operating the memory with BCR module of FIGS. 1 and 5, in accordance with embodiments of the present invention.
Figure 5:
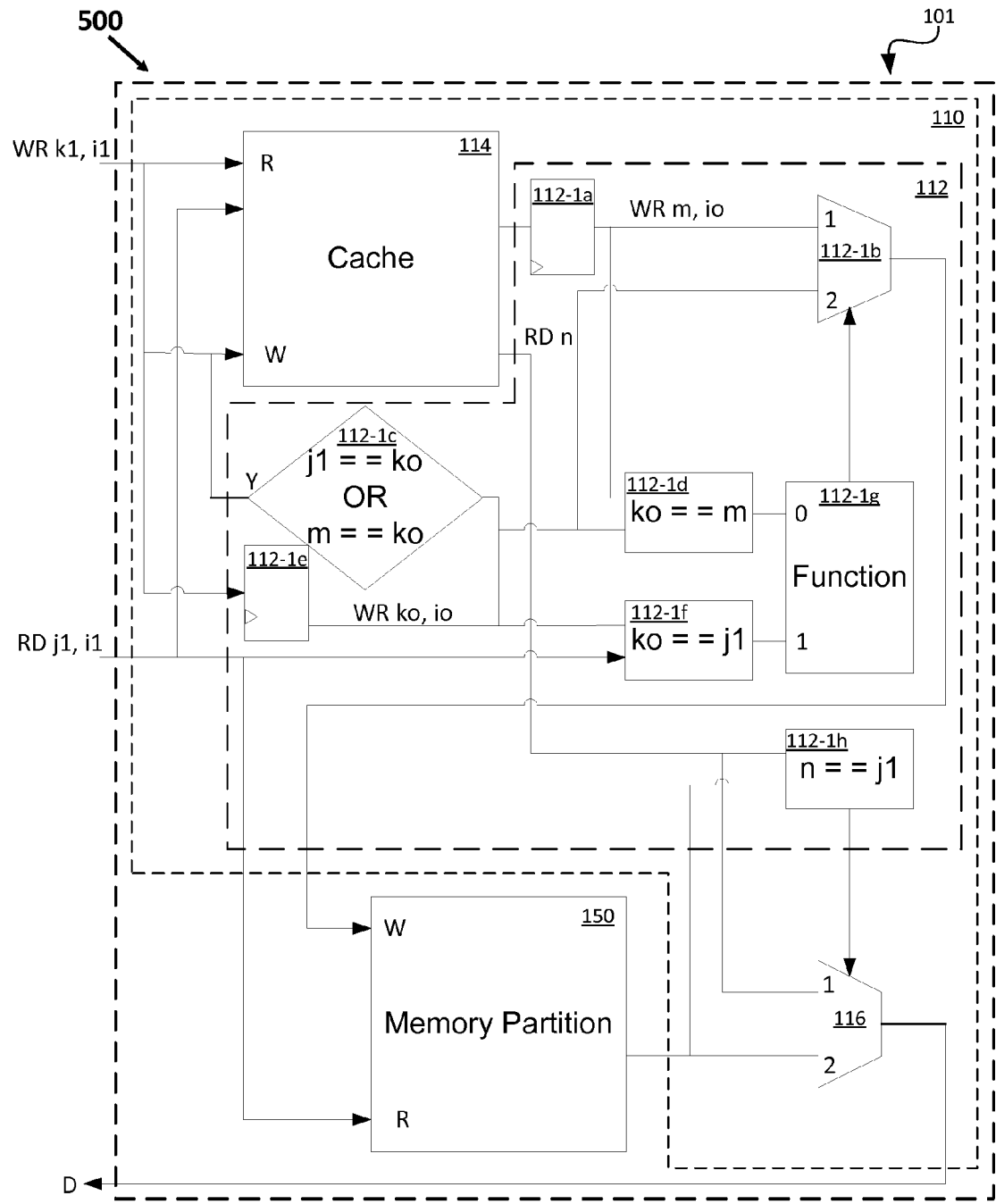
FIG. 5 is a detailed block diagram of the memory with the BCR module, in accordance with embodiments of the present invention.

Referring now to FIG. 4, a flow chart 400 is shown that illustrates the method of operating the memory device 101 with BCR module 101, in accordance with embodiments of the present invention. Embodiments of memory device are depicted in FIGS. 1 and 5.

At 410, a write command is received. For example, a write command (e.g. notation, WR ko, io) is received to write a data word to a memory location 150*n*, j at bank address, n (e.g. notation, ko), and index j, (e.g. notation, io) in the memory partition 150.

At 420, read data word portion and tag data are read. For example, the data word portion 214*i*–1 (e.g. notation, do) and the tag data 214*i*–2 at cache location 114*i* (e.g. notation, io) are read from the cache 114 (e.g. notation of entire step, {do, m}=$[io]).

At 430, it is determined if the bank address is equal to the tag data. For example, the condition is tested whether the bank address, n, of the memory location 150*n*, j (e.g. notation, ko) of the write command, is equal to the tag data 214*i*–2 (e.g. notation, m) at cache location 114*i* (e.g. notation of entire step, ko==m).

If the bank address, n, of the memory location 150n, j, of the write command, is equal to the tag data 214i–2 at cache location 114i, then, at 432, write the data word portion. For example, the data word portion 214i–1 of the cache data 214i is written to a merge-modify write operation with the data word (e.g. notation, [DATA-Wo]) of the write command (e.g. notation of entire step, $[io]←WR ko, io).

At 440, a read command is received. For example, a read command (e.g. notation, RD j, i1) is received to read a data word from a memory location at a bank address (e.g. notation, j) and index (e.g. notation, i1) in the memory partition 150 (e.g. notation of entire step, RD j, i1)

The read command information is made available to the next operation 450. If the bank address, n, of the memory location 150n, j of the write command, is not equal to the tag data 214i–2, at cache location 114i, then, at 450, it is determined if the bank address, j is equal to bank address, n. For example, the condition is tested whether the bank address, given by j of the read command, is equal to the bank address, n, of the memory location 150n, j of the write command. (e.g. notation of entire step, j==ko)

If the bank address, j, of the read command, is not equal to the bank address, n, of the memory location 150n, j of the write command, then, at 452, the memory data is written. For example, the memory data 250n, j in memory bank 150n of the write command, in memory partition 150 is written to in a write operation with the data word of the write command (e.g. notation of entire step, WRITE ko, io)

If the bank address, given by j of the read command, is equal to the bank address, n, of the memory location 150n, j, of the write command, then, at 454, if the cache data is valid, then the memory data is written. For example, if the cache data 214i is valid, then the memory data in the memory bank given by the tag data 214i–2, m, in memory partition 150 is written to in a write operation with the data word portion 214-i, (e.g. notation, [DATA-C]), of the cache data (e.g. notation of entire step, WRITE m, io with {do}.

Also, if the bank address, given by j of the read command, is equal to the bank address, n, of the memory location 150n, j of the write command, then, at 456 (and in parallel with operation 454), the cache data is written. For example, if the cache data 214i is valid, then the cache data portion 214i–1 in cache location 114i in cache 114 is written to in a write operation with the data word (e.g. notation, [DATA-Wo]), of the write command (e.g. notation of entire step, $[io]←WR ko, io). The combination of operations 454 and 456 may be referred to, herein, by the term of art, "swap," or alternatively, "eviction."

At 460, the data word is read. For example, the data word (e.g. notation, [DATA-M]), from a memory location at a bank address, and index, in the memory partition 150 is read (e.g. notation of entire step, READ j, i1)

At 462, the data word and tag data are read. For example, in parallel with operation 460, a data word portion, r1, and tag data, n, at a cache location are read from the cache 114 (e.g. notation of entire step, {r1, n}=$[i1]).

At 470, the value read at 460 is stored in a register as a data word, ro. (e.g. notation of entire step, STORE as: ro).

At 480, it is determined whether the bank address is equal to the tag data. For example, the condition is tested whether the tag data, n, at the cache location read in operation 462 is equal to the bank address, j, of the memory location given by j of the read command, READ j, i1 (e.g. notation of entire step, n==j).

At 482, if the tag data, n, at the cache location read in operation 462 is equal to the bank address, j, of the memory location given by j of the read command, RD j, i1, then the data word, r1, is output in response to the read command, RD j, i1 (e.g. notation of entire step, OUT←r1).

At 484, the data word is output. For example, if the tag data, n, at the cash location read in operation 462 is not equal to the bank address, j, of the memory location given by j of the read command, READ j, i1, then the data word, ro, is output in response to the read command, RD j, i1 (e.g. notation of entire step, OUT←ro)

With reference now to FIG. 5 and further reference to FIG. 4, in accordance with embodiments of the present invention, a detailed block diagram 500 is shown of the serial memory device 101 with the BCR module. As shown in FIG. 5, the serial memory device 101 with BCR module 110 includes a memory partition 150.

The BCR module 110 includes a bank-conflict resolver 112 that includes BCR logic, a cache 114, and a read-output multiplexer 116.

The bank-conflict resolver 112 includes various blocks of circuitry. For example, blocks 112-1a-h which will be described in further detail below.

The operation of the serial memory device 101 with BCR module 110 shown in FIG. 5 may be explained with the aid of the flow chart 400 of FIG. 4. The cache 114 and a first write delay 112-1e receive the new write command (e.g., WR k1, i1), at 410. Throughout the following discussion the subscripts of indices may differ from those previous used in the description of FIG. 4.

After the write delay 112-1e, the write command is designated by a prior write command (e.g., WR ko, io). The write command is propagated to the following: the memory partition write input multiplexer 112-1b, a first memory bank index comparator 112-1d, a second memory bank index comparator 112-1f, and a conditional gate 112-1c.

After the cache receives the write command, at 420, the cache reads cache data from the cache location (indexed by io), and outputs the data word portion, {do}, along with the bank memory location index, m, and the memory location index, io, to a second write delay 112-1a. After the delay, this appears on the output of the second write delay 112-1a as a write command from cache, (e.g., WR m, io).

The write command from cache appears on the input of the write input multiplexer 112-1b and the input of the first memory bank index comparator 112-1d. The write command from cache, WR m, io, and the delayed write command, WR ko, io, are received by the first memory bank index comparator 112-1d, if the condition, ko==m, is satisfied, at 432, the cache may be written with the delayed write command, WR ko, io.

With further reference to FIGS. 4 and 5, in accordance with embodiments of the present invention, the cache 114 and the second memory bank index comparator 112-1f receive the read command, RD j1, i1, at 440.

If the condition tested by the first memory bank index comparator 112-1d, ko==m, is not satisfied, at 450, the condition, j==ko, may be tested in the conditional gate 112-1c and the second memory bank index comparator 112-1f.

If the condition, j1==ko OR m==ko, is satisfied, the cache may be merged with the delayed write command, WR ko, io, sent through the conditional gate 112-1c, at 456.

If the condition, j1==ko, is satisfied, and the condition, ko==m, is not satisfied, which are tested by the second memory bank index comparator 112-1f and by the first memory bank index comparator 112-1d, respectively, the logic function generator 112-1g receives a logical "1" from the second memory bank index comparator 112-1f and a logical "0" from the first memory bank index comparator 112-1d, respectively. For this combination of logic values, the logic function generator 112-1g sends a signal to the write input multiplexer 112-1b to pass the write command from cache, WR m, io, appearing on input 1 of the write input multiplexer 112-1b to be written to the memory partition 150, at 454, if the cache data is valid in the write command from cache, WR m, io. The combination of operations 452 and 454, just described, constitute the "swap" previously described.

If the condition, j1==ko, is not satisfied, and the condition, ko==m, is not satisfied, which are tested by the second memory bank index comparator 112-1f and by the first memory bank index comparator 112-1d, respectively, the logic function generator 112-1g receives a logical "0" from the second memory bank index comparator 112-1f and a logical "0" from the first memory bank index comparator 112-1d, respectively. For this combination of logic values, the logic function generator 112-1g sends a signal to the write input multiplexer 112-1b to pass the delayed write command, WR ko, io, appearing on input 2 of the write input multiplexer 112-1b to be written to the memory partition 150, at 452.

With reference now to FIG. 5 and further reference to FIG. 4, in accordance with embodiments of the present invention, the function of component parts of the serial memory 101 with BCR module 110 operations associated with the read command, RD j1, i1, are next described.

The read command, RD j1, i1, appears on the inputs to the cache 114 and the memory partition 150, at 440. The memory partition is read at bank location index, j1, and memory location index, i1, at 460.

After the cache receives the read command, RD j1, i1, at 462, the cache reads cache data from the cache location indexed by i1, and outputs the data word portion, {r1}, along with the tag data, n, as cache read data, RD n, output to input 1 of the read-output multiplexer 116, and an input of a third memory bank index comparator 112-1h.

At 470, the memory partition outputs the data word, ro, stored at bank location index, j1, and memory location index, i1, along with the bank memory location index, j1, to input 2 of the read-output multiplexer 116, and the other input of the third memory bank index comparator 112-1h. The cache read data, RD n, output from cache, and the read data output from the memory partition 150, are received by the third memory bank index comparator 112-1h, and the condition, n==j1, is tested, at 480.

If the condition, n==j1, is satisfied, at 482, the read-output multiplexer 116 receives a signal to pass through the data word portion, r1, of the cache read data, RD n.

If the condition, n==j1, is not satisfied, at 484, the read-output multiplexer 116 receives a signal to pass through the data word, ro, of the read data output from the memory partition 150.

In various embodiments error correction operation may be applied to data received by, or sent by, the serial memory device 101. For example, an error correction code is generated on a data word of a write command and/or an error correction is performed on cache data of a data word portion of the cache data.

In accordance with embodiments of the present invention, a bandwidth engine (BE) may include at least one memory partition 150 with BCR module 110. For example, each serial memory includes a memory partition and a dedicated BCR module. Thus, the BE includes a plurality of memory a plurality of partitions. By way of example, the number of memory partitions may be four. By way of example, one memory partition 150 may include memory banks 152a, 152n.

In addition to the component parts of the serial memory device 101 with BCR module 110 described herein, the memory 150 further includes array manager circuitry coupled to the plurality of memories with BCR module, and serializer/deserializer (SerDes) interfaces coupled to the array manager circuitry.

In various embodiments, methods and associated method steps described herein, are carried out by processors and electrical components under the control of computer readable and computer executable instructions. The computer readable and computer executable instructions reside, for example, in a data storage medium such as computer usable volatile and non-volatile memory. However, the computer readable and computer executable instructions may reside in any type of computer readable storage medium. In some embodiments, method steps are performed at least by serial memory device 101.

The invention claimed is:

1. A memory device comprising:
   a block of memory cells that is a random access memory with multiple ports, the block of memory cells partitioned into a plurality of subunits that each has only a single port;
   a cache coupled to the block of memory cells, wherein:
      the cache is adapted to store data;
      the cache is adapted to handle a plurality of accesses to the subunits of memory cells without a conflict such that the memory device appears to be a random access memory to the plurality of accesses;
      the cache contains validity data that indicates whether data stored in the cache is valid; and
      a read command is able to be performed without latency relative to a write command; and
   a bank-conflict resolution logic (BCR) that is adapted to:
      test validity data of the data stored in the cache; and
      write a data word of the write command to a memory location of a memory bank in the memory partition if the validity data stored in the cache indicates that the data stored in the cache is invalid; and wherein:
      the block of memory cells is a memory partition; and
      the subunit of memory cells is a memory banks.

2. The memory device of claim 1, wherein the plurality of accesses comprises:
   one or more of a read command and a write command.

3. The memory device of claim 1, wherein:
   the cache has a number of addressable locations;
   each of the plurality of subunits has a number of addressable locations;
   the number of addressable locations in the cache is equal to the number of addressable locations in one of the plurality of subunits of the memory; and
   the validity data is stored in the cache and not in the block of memory cells.

4. The memory device of claim 1, wherein a flat memory is adapted to perform multiple accesses concurrently.

5. The memory device of claim 1 further comprising:
   a serial memory.

6. The memory device of claim 1, wherein the memory is adapted such that a host scheduler is able to write and to read to a same subunit without having a conflict.

7. The memory device of claim 1, wherein the memory is adapted such that a read operation and a write operation are able to be performed to a same address in the subunit without a conflict.

8. The memory device of claim 1, wherein the memory has a single read port and a single write port.

9. The memory device of claim 1, wherein:
the BCR is configured to have a cycle time for operation;
the memory bank is configured to have a cycle time for operation; and
the cycle time of the BCR is less than the cycle time of the memory banks.

10. The method of claim 9, wherein:
the plurality of access to the subunits without a conflict is satisfied regardless of a quantity of the memory banks in the block of memory.

11. The memory device of claim 1, wherein:
the data stored in the cache comprises a data word portion, and a tag data portion; and
the tag data portion identifies a memory bank of the memory location, the validity data, and error-correction-code (ECC) data.

12. The memory device of claim 11, wherein:
the BCR is further adapted to test the tag data of the cache data for equality with a memory bank address of the memory location if the validity data indicates that the cache data is valid.

13. The memory device of claim 12, wherein the BCR is further adapted to:
merge-modify the data word of the write command with a data word portion of the cache data stored in the cache if the tag data of the cache data indicates that the memory address of the cache data equals a memory address of the memory location of the write command.

14. The memory device of claim 12, wherein the BCR is further adapted to:
write the data word into the memory location of the memory bank in the memory partition, if the tag data of the cache data does not equal a memory bank address of the memory location of the write command.

15. The memory device of claim 1, wherein:
the BCR is further adapted to write the data word of the write command to a cache location if the address of the write command is to a bank that is being read in response to a simultaneous read command.

16. The memory device of claim 1, wherein the BCR further comprises:
an error-correction-code (ECC) module adapted to correct errors in the data word.

17. The memory device of claim 1, wherein:
the BCR is centrally located on a die on which the memory partition is fabricated.

18. The memory device of claim 1, wherein:
each of the memory banks of the memory partition has a data word width;
the cache has a data-word width; and
the data word width of the memory banks is equal to the data word width of the cache.

19. The memory device of claim 1, wherein:
the BCR further comprises a tag data register and tag data comparator.

20. The memory device of claim 1, further comprising:
a read-output multiplexer coupled to the plurality of memory cells and to the cache; wherein:
the read-output multiplexer receives in parallel a data word portion from the cache for a read command and a data word from the memory bank for the read command.

21. The memory device of claim 20 wherein the read-output multiplexer is adapted to:
send the data word portion from the cache for output from a memory if a tag data is identical to a memory location that is being addressed by the read command; and
send the data word from the memory bank of the memory partition as output from the memory if the tag data is different from the memory location that is being addressed by the read command.

22. The memory device of claim 1, wherein:
a given word of data received by the memory device is comprised of a plurality of portions; and
the validity data describes whether each of the plurality of portions of the given word is separately valid.

23. The memory device of claim 22, wherein:
the validity data describes whether a first portion of a given word is valid and whether a second portion of a given word is valid, wherein the first portion and the second portion each comprise approximately half of the word.

24. The memory device of claim 1, wherein:
the data stored in the cache is evicted by writing the data from the cache to memory when a write command to a first memory bank and a simultaneous read command to the first memory bank occurs and when:
the data stored in the cache is valid; and
the data stored in the cache is associated with a memory bank address different than the first bank address of the write command and the read command.

25. A memory device comprising:
means for storing data that is a random access with multiple ports partitioned into a plurality of subunits that each has only a single port; and
means for caching data, wherein:
the means for caching data is coupled to the means for storing data;
the means for caching data is adapted to handle a plurality of accesses to the subunits of memory cells without a conflict such that the memory device appears to be a random access memory to the plurality of accesses;
the means for caching data contains validity data that indicates whether data stored in the cache is valid;
a read command is able to be performed without latency relative to a write command; and
means for bank conflict resolution (BCR) that is adapted to:
test validity data of the data stored in the cache; and
write a data word of the write command to a memory location of a memory bank in the memory partition if the validity data stored in the cache indicates that the data stored in the cache is invalid; and wherein:
the block of memory cells is a memory partition; and
the subunit of memory cells is a memory banks.

26. A method of reading data from a memory device, the method comprising:
receiving an access at a block of memory cells that is a random access memory with multiple ports, the block of memory cells partitioned into a plurality of subunits that each has only a single port; and
receiving an access at a cache coupled to the block of memory cells, wherein:
the cache is adapted to store data;
the cache is adapted to handle a plurality of accesses to the subunits of memory cells without a conflict such that the memory device appears to be a random access memory to the plurality of accesses;

the cache contains validity data that indicates whether data stored in the cache is valid;

a read command is able to be performed without latency relative to a write command; and a data word is always read from the cache at a cache index location equivalent to an index location of the access command, regardless of whether the access command is a read command or a write command.

27. A memory device comprising:

a block of memory cells that is a random access memory with multiple ports, the block of memory cells partitioned into a plurality of subunits that each has only a single port;

a cache coupled to the block of memory cells, wherein:
the cache is adapted to store data;

the cache is adapted to handle a plurality of accesses to the subunits of memory cells without a conflict such that the memory device appears to be a random access memory to the plurality of accesses;

the cache contains validity data that indicates whether data stored in the cache is valid; and a read command is able to be performed without latency relative to a write command; and a read-output multiplexer coupled to the plurality of memory cells and to the cache; wherein:
the read-output multiplexer always receives a data word portion from the cache in response to a read command, regardless whether the data word in the cache is valid or not.

28. The memory device of claim 27 wherein:

the BCR is adapted to always write data of the write command into the cache if a bank address of the write command equals a bank address stored in cache, and if data in the cache is marked as valid at a cache index location equivalent to a write address index location.

29. The method of claim 26, further comprising:

receiving a read command at the block of memory cells, wherein:

a data word is always read from the block of memory cells at an index location equivalent to an index location of the read command, regardless of whether a data word that is output from the memory device for the read command originated from the block of memory cells or from the cache.

* * * * *